United States Patent [19]

Fletcher et al.

[11] Patent Number: 5,132,564

[45] Date of Patent: Jul. 21, 1992

[54] BUS DRIVER CIRCUIT WITH LOW ON-CHIP DISSIPATION AND/OR PRE-BIASING OF OUTPUT TERMINAL DURING LIVE INSERTION

[75] Inventors: Thomas D. Fletcher, Orem; Emil N. Hahn, Lindon, both of Utah

[73] Assignee: North American Philips Corp., New York, N.Y.

[21] Appl. No.: 558,935

[22] Filed: Jul. 27, 1990

[51] Int. Cl.$^5$ .................. H03K 17/16; H03K 19/0175
[52] U.S. Cl. .................................. 307/443; 307/475; 307/446
[58] Field of Search ............... 307/443, 475, 530, 446, 307/570

[56] References Cited

U.S. PATENT DOCUMENTS

| | | | |
|---|---|---|---|
| 3,614,467 | 10/1971 | Tu | 307/215 |
| 4,263,645 | 4/1981 | Zellmer | 363/49 |
| 4,415,817 | 11/1983 | Fletcher | 307/454 |
| 4,678,943 | 7/1987 | Uragami et al. | 307/446 |
| 4,746,818 | 5/1988 | Hafner | 307/363 |
| 4,797,582 | 1/1989 | Nguyen | 307/475 |
| 4,883,988 | 11/1989 | Ide et al. | 307/446 |
| 4,918,329 | 4/1990 | Milby et al. | 307/443 |
| 4,941,128 | 7/1990 | Walda et al. | 365/203 |
| 4,988,888 | 1/1991 | Hirose et al. | 307/443 |
| 5,028,809 | 7/1991 | Watanabe et al. | 307/137 |

FOREIGN PATENT DOCUMENTS 228585 7/1987 European Pat. Off. .
1-251655 10/1989 Japan .
2185648 7/1987 United Kingdom .

OTHER PUBLICATIONS

Alvarez, BiCMOS Technology and Applications, 1989, pp. 166–170.
Lim et al., A 9100 Gate ECL/TTL Compatible BiCMOS Gate Array, 1987, pp. 190–194.

*Primary Examiner*—David Hudspeth
*Assistant Examiner*—Andrew Sanders
*Attorney, Agent, or Firm*—R. Meetin; A. Tamoshunas; J. Haken

[57] ABSTRACT

The driver circuit comprises drive means (Q2) for drawing an output current from a bus line (13) in a first state of the circuit. An output diode (S1) in the path of the output current is reverse biased in a second state of the circuit to isolate the drive means from the bus line. A control current ($I_{Q2B}$) for the drive transistor is drawn from the bus line (13), beyond the output diode (S1). By this means, power dissipation (heat) within the driver circuit due to the control current is eliminated. The driver circuit also comprises means (26, S3, P1) for biasing the output during connection of the circuit to a live bus line, so as to reduce noise for other circuits connected to the bus line.

36 Claims, 2 Drawing Sheets

BUS DRIVER CIRCUIT WITH LOW ON-CHIP DISSIPATION AND/OR PRE-BIASING OF OUTPUT TERMINAL DURING LIVE INSERTION

FIELD OF THE INVENTION

The invention relates to driver circuits for transmitting logic signals via bus lines, in particular bus lines to which many such driver circuits are connected simultaneously.

BACKGROUND ART

A conventional driver circuit comprises:
an output terminal for connection to a bus line;
a first supply terminal for connection to a first voltage source; and
first drive means for in a first state of the driver circuit completing a current path from the output terminal to the first supply terminal for passage of an output current; and
control means for supplying a control current to the first drive means.

Such a circuit can cause a desired voltage swing on the bus line in a time period determined by the capacitance of the bus line, the magnitude of the voltage swing and the magnitude of the output current. Three measures that can be used to increase the speed of communication ar (i) to increase the current capability of the drive means, (ii) to reduce the bus line capacitance and (iii) to reduce the voltage swing required.

An example of a standard bus system which seeks higher operating speeds by a combination of these three measures is the Futurebus+ system, defined by IEEE Standard 896.1. Many other standard and proprietary bus systems have sought to provide high-speed communication by one or more of these means, and will continue to do so into the future.

In such systems, ever higher output currents are specified. The power dissipation (heat) which inevitably results from these high currents becomes a constraint when it is desired to include one or more driver circuits in a single integrated circuit (chip). Additional power dissipation arises from control circuitry and can make this constraint more severe. For example, bipolar transistors make compact, high-current drive means, but demand substantial control currents to keep them turned on. The power dissipation involved in supplying these control currents can amount to a significant portion of the total power dissipation of the chip.

When an individual driver circuit is not active, it becomes part of the load for the other driver circuits connected to the bus line. Unfortunately, high-current drive means, and bipolar transistors especially, tend to have large output capacitances. Coupling these capacitances to the bus line negates the speed advantage gained from the higher output current. Ideally, output capacitances of individual circuits should make only a minor contribution to the overall capacitance of the bus line, so that bus line performance is independent of the number of module connected.

A further consequence of the output capacitance of a driver circuit is that the driver cannot be connected to a "live" bus line (that is, one on which other drivers and receivers are communicating) without introducing some noise on the bus line. A new circuit module suddenly connected to a live bus line can therefore result in loss of data for other modules, or even total system failure. Since many modular data processing systems are used in critical, real-time applications such as process control and telephone switching, live insertion of new modules is desirable, while the consequences of data loss or system failure can be very serious. Note that reducing the voltage swing between the logic levels on the bus line increases speed only at the expense of reducing the inherent noise immunity of the receiving modules.

U.S. Pat. No. 4 415 817 describes a logic circuit including a bipolar drive transistor, a bipolar control transistor, and a plurality of output diodes. Each output diode carries an output current to the input of a respective further logic circuit. The output diodes are provided to isolate these further circuits from one another, and to provide a high "fanout" of the logic circuit (the number of inputs that can be driven by the logic circuit).

SUMMARY OF THE INVENTION

It is an object of the invention to address one or more of the above problems and to enable the provision of an improved driver circuit for bus lines.

In a first aspect, the invention provides a driver circuit comprising the elements set forth in the second opening paragraph, and further comprising an output diode connected in the path of the output current for isolating the first drive means from the output terminal in a second state of the driver circuit, wherein the control means is connected to the output terminal beyond the output diode so as to draw the control current for the first drive means from the output terminal.

The output diode becomes reverse biased in the second state, and thereby acts as a small capacitance in series with the large capacitance of the drive means, reducing the overall output capacitance of the circuit. At the same time, the drawing of the control current from the output terminal beyond the output diode means that some or all of the power dissipation due to the control current will occur outside the driver circuit, relieving somewhat the constraint on the packaging of driver circuits in an integrated circuit.

In contrast, the control transistor in the logic circuit of U.S. Pat. No. 4 415 817 draws the control current for the drive transistor via a resistor from an internal supply terminal of the logic circuit, and not from the output terminal. Thus the control current in the known logic circuit makes a full contribution to power dissipation within the logic circuit package. The known logic circuit is not described as being suitable driving a high-speed bus line via a single output diode. The high frequency (capacitive) properties of output diodes are not discussed in U.S. Pat. No. 4 415 817.

The output diode may be a Schottky diode. The capacitance of a Schottky diode is lower than that of a p-n diode, and thus provides better isolation. The lower forward voltage drop of a Schottky diode also relieves some design constraints and assists in reducing on-chip power dissipation The control means may have a characteristic resistance such that the bipolar transistor is prevented from saturating in the first state, and instead maintains a predetermined voltage at the output terminal, relative to the first voltage source. This voltage setting mechanism can assist in achieving a low output voltage swing.

In embodiments where the control means comprises an insulated gate field-effect transistor whose drain-source path is connected between the output terminal and the base of the bipolar transistor, the drain-source on-resistance may constitute the characteristic impedance of the control means. The use of insulated gate transistors can reduce the additional power dissipation, and can be designed to provide temperature compensation of the predetermined voltage The circuit may further comprise active turn-off means for in the second state pulling the base of the bipolar transistor towards the voltage of the emitter of that transistor. This enables a fast turn-off of the drive transistor. The active turnoff means may include means for maintaining a predetermined voltage on the base of the bipolar transistor, to enable the transistor to be turned on again quickly.

The driver circuit may further comprise a second supply terminal for connection to a second voltage source and second drive means for in the second state pulling the voltage at an electrode of the output diode remote from the output terminal toward the voltage of the second voltage source, so as to reverse bias the output diode. An active second drive means can bring the circuit into the second state more quickly than a mere resistor, for example. The second drive means may include means for limiting the reverse bias applied to the output diode in the second state.

The invention provides in a second aspect a driver circuit comprising:
  an output terminal for connection to a bus line;
  a first supply terminal for connection to a first voltage source;
  first drive means for in a first state of the driver circuit completing a current path from the output terminal to the first supply terminal for passage of an output current;
  an output diode connected in the path of the output current for isolating the first drive means from the output terminal in a second state of the driver circuit; and
  pre-biasing means for applying a reverse bias to the output diode before connection of the output terminal to the bus line.

By ensuring that reverse bias is applied to the output diode in advance of connection to the bus line, the pre-biasing means enables the diode to isolate the large capacitance of the drive means from the bus line during live insertion.

The pre-biasing means may comprise a bias supply terminal for connection to a bias voltage source, which bias voltage source is connected and active before connection of the output terminal to the bus line. The bias voltage source may for example comprise a battery, or a connector pin designed to make contact before other connector pins make contact during connection of a circuit module to a live bus system.

Such a driver circuit may further comprise means for isolating the bias supply terminal from the remainder of the circuit once conduction of a main supply current is established, and/or means for isolating the bias supply terminal from the remainder of the circuit when no bias voltage source suitable for pre-biasing is connected to the bias supply terminal.

The invention provides in a third aspect a driver circuit having an output terminal for connection to a bus line carrying a two-level data signal, the circuit comprising pre-biasing means for biasing the output terminal of the driver circuit to an intermediate level between the two levels of the data signal before connection of that terminal to the bus line. The noise generated during live insertion of such a driver circuit is reduced because of the reduced voltage swing between the intermediate voltage and the voltage actually present on the bus line.

When such a driver circuit comprises drive mean for passing an output current from the bus line to a supply terminal of the circuit, an output capacitance of the circuit may comprise a first component in series with the drive means and a second component in parallel with the drive means, while the biasing means comprises means for charging in series to a predetermined level the first and second components of the output capacitance, such that the output terminal is charged to the intermediate level by division of charge between the first and second components of the output capacitance.

The first component of the output capacitance may for example include the reverse biased capacitance of an output diode connected in the path of the output current between the drive means and the output terminal.

The second component of the output capacitance may for example include the capacitance of an electrostatic discharge protection device.

The invention further provides a circuit module for connection to a bus system, which circuit module includes a driver circuit in accordance with the second and/or third aspect of the invention as set forth above.

The first, second and third aspects of the invention as set forth above may be used individually or in combination in a driver circuit according to the present invention.

BRIEF DESCRIPTION OF THE DRAWINGS

Embodiments of the invention will now be by way of example, with reference to the accompanying drawing, in which.

DETAILED DESCRIPTION OF THE EMBODIMENTS

Figure 1:
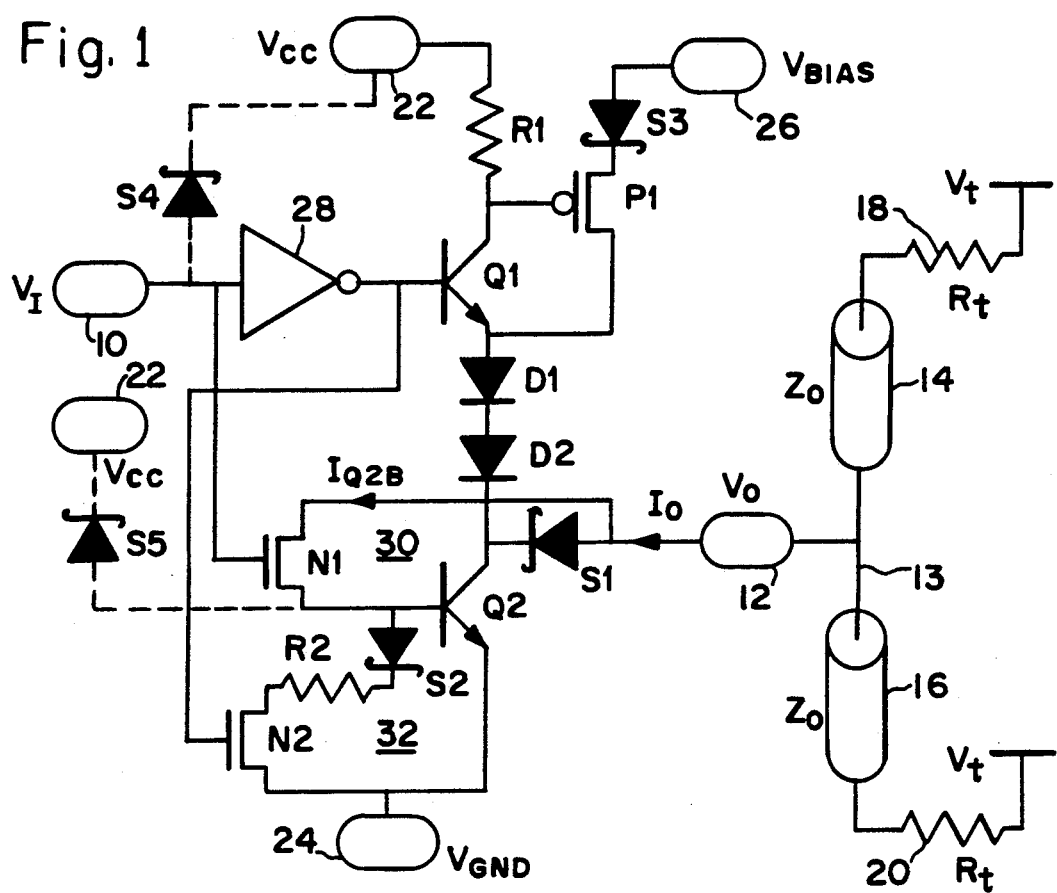
FIG. 1 shows a driver circuit in accordance with the present invention.

FIG. 1 shows a driver circuit which is connected between an input terminal 10 ($V_I$) and an output terminal 12 ($V_O$). The output terminal is shown connected to an intermediate point on a bus line 13 which is modelled in FIG. 1 by transmission lines 14 and 16, terminated by respective resistors 18 and 20. The transmission lines 14 and 16 have a characteristic impedance $Z_O$, while the terminating resistors 18 and 20 connect the bus line to a terminating voltage $V_t$ with a resistance $R_t$ each. The output terminal 12 ($V_O$) may be an output pin of an integrated circuit package including the driver circuit, and also a connector for making the connection to the bus line 13.

The driver circuit has two main supply terminals 22 ($V_{CC}$) and 24 ($V_{GND}$) and a bias supply terminal 26 ($V_{BIAS}$). The supply terminals 22, 24 and 26 may be the supply pins of the integrated circuit package, which may include several similar driver circuits. Between the supply terminal 22 ($V_{CC}$) and the supply terminal 24 ($V_{GND}$), there are connected in series: a first resistor R1, an upper NPN transistor Q1, two p-n diodes D1 and D2 and a lower NPN transistor Q2. The NPN transistors Q1 and Q2 have their emitters towards terminal 24 ($V_{GND}$) and the diodes D1 and D2 have their cathodes towards terminal 24 ($V_{GND}$). The collector of the lower NPN transistor Q2 is connected to the cathode of a first Schottky diode S1, whose anode is connected to the output terminal 12 ($V_O$).

The input terminal 10 ($V_I$) is connected to the input of a CMOS inverter 28 and also to the gate of an N-channel insulated gate field-effect transistor N1. The term "CMOS" is used in a broad sense herein, and includes in particular insulated gate transistor technology wherein the transistor gates are made of polysilicon rather than metal. The drain of transistor N1 is connected to the output terminal 12 ($V_O$), while the source of transistor N1 is connected to the base of the lower NPN transistor Q2. The devices N1, Q2 and S1 together form a lower drive arrangement 30 of the driver circuit.

The output of the inverter 28 is connected to the base of the upper NPN transistor Q1 and also to the gate of a further N-channel insulated gate transistor N2. The drain of transistor N2 is connected to the base of the lower NPN transistor Q2 via a second resistor R2 and a second Schottky diode S2 (cathode to R2). The source of transistor N2 is connected to the supply terminal 24 ($V_{GND}$). The devices N2, R2 and S2 form a base pull-off arrangement 32 for the lower NPN transistor Q2. A P-channel insulated gate transistor P1 has its source and gate connected to the emitter and collector respectively of the upper NPN transistor Q1. The collector of transistor Q1 is connected to the bias supply terminal 26 ($V_{BIAS}$) via a third Schottky diode S3.

Figure 2:
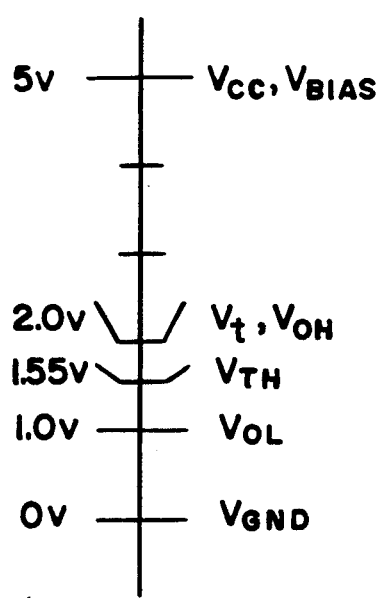
FIG. 2 shows various voltage levels for a specific embodiment of the driver circuit of FIG. 1.

FIG. 2 shows the voltage levels $V_{CC}$, $V_{GND}$ and so forth that are present in normal operation in a version of the FIG. 1 circuit suitable for use as a backplane driver in a Futurebus+ system. This version of the circuit is presented by way of example only. The invention is in no way limited to application in Futurebus+ or any other standard bus system.

In normal operation, a positive supply voltage $V_{CC}=5.0v$ is applied to the terminal 22, while a ground supply voltage $V_{GND}=0.0v$ is applied to terminal 24. A positive bias voltage $V_{BIAS}$, equal to $V_{CC}$, is applied to the terminal 26. Thus, in normal operation, the P-channel transistor is turned off (nonconducting), so that the elements P1 and S3 may be ignored. The elements P1 and S3 play a role in the "live insertion" of the driver circuit, to be described below with reference to FIG. 3.

The driver circuit receives at its input 10 a logic signal $V_I$ at conventional CMOS levels, and produces at its output 12 a corresponding inverted output signal $V_O$ at the logic levels of the Futurebus+ system. In that system, a low logic level is represented by $V_O=V_{OL}=1.0v$ when $V_I$ is high, while a high level is represented by $V_O=V_{OH}=2.0v$ when $V_I$ is low. A threshold voltage $V_{TH}=1.55v$ is used by receiver circuits connected to the bus line 13 to distinguish between logic levels. The standard in fact specifies the following tolerance ranges (min,max): $V_{OL}$ (0.75,1.1V); $V_{OH}$ (1.9V,2.0V); $V_{TH}$ (1.47V,1.62V); $V_{CC}$ (4.5V,5.5v).

When $V_I$ is low (indicating the $V_{OH}$ state), the output of the inverter 28 is high ($V_{CC}$). Therefore the transistor N1 is turned off, while the transistor N2 and the upper NPN transistor Q1 are both turned on (conducting). In this state, therefore, the pull-off arrangement 32 actively turns off the lower NPN transistor Q2. The Schottky diode S2 has a characteristic forward voltage drop $V_{S2}$ which is slightly less than the characteristic base-emitter forward voltage $V_{BE}$ of the NPN transistor Q2. This will improve switching speed in a subsequent transition to the $V_{OL}$ state, since the capacitance inherent in the base of transistor Q2 need only be charged from $V_{S2}$ to $V_{BE}$ before the NPN transistor Q2 will turn on.

At the same time, the transistor Q1 is conducting and the diodes D1 and D2 are forward biased. The voltage drop from $V_{CC}$ across the transistor Q1 and the diodes D1 and D2 means that the cathode of the output Schottky diode S1 is pulled up to a voltage around 3v, that is, somewhere between $V_{OH}$ and $V_{CC}$. The output Sohottky diode S1 is therefore reverse biased and, since the transistor Q2 is turned off, no static current flows in the driver circuit in the $V_{OH}$ state. In the $V_{OH}$ state, the circuit is essentially passive, the bus line 13 being held at $V_{OH}$ by the terminating voltage $V_t$ acting via the terminating resistors 18 and 20. In a transition from the $V_{OL}$ state to the $V_{OH}$ state, the capacitance $C_{S1}$ of the Schottky diode S1 provides capacitive coupling to the output pin 12, to assist a rapid transition on the bus line 13.

Figure 3:
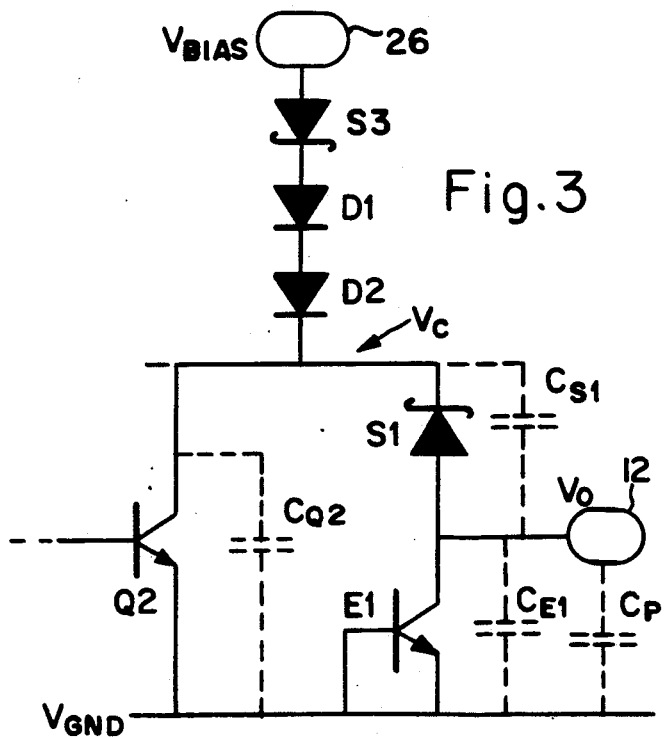
FIG. 3 shows parasitic capacitances in the driver circuit of FIG. 1.

FIG. 3 shows $C_{S1}$ and other capacitances present in the driver circuit of FIG. 1. The transistor Q2 has a large effective collector emitter capacitance $C_{Q2}$ due to its large size and the Miller effect which multiplies the actual collector-base capacitance by the current gain $\beta$ (beta) of the transistor. This large capacitance $C_{Q2}$ is decoupled from the output pin 12 in the $V_{OH}$ state by the smaller capacitance $C_{S1}$ of the reverse biased output Schottky diode S1. Also connected to the output pin 12 is an electrostatic discharge (ESD) protection device E1, represented as a further NPN transistor with its base and emitter both connected to $V_{GND}$. The ESD device E1 has a parasitic capacitance $C_{E1}$, which is not enhanced by the Miller effect because of the base-emitter connection. Also present is the capacitance $C_P$ inherent in the output pin 12, and the connections from it to the bus line 13. The total output capacitance $C_O$ of the driver circuit is approximately $C_{S1}+C_{E1}+C_P$, and in particular does not include the large capacitance $C_{Q2}$ of the lower NPN transistor Q2. The circuit can therefore be designed to have low output capacitance $C_O$. A maximum of $C_O=5$ picofarads (5pF) is specified for the Futurebus+ system.

Subsequently, when $V_I$ goes high (to $V_{CC}$), a transition to the $V_{OL}$ state is initiated. The output of the inverter 28 goes low (to $V_{GND}$). Transistors Q1 and N2 are thus turned off, while the N-channel base control transistor N1 turns on. Since $V_O$ is still equal to $V_{OH}$ at this point, transistor N1 can supply base current $I_{Q2B}$ to the lower NPN transistor Q2. This base current turns on transistor Q2 which draws an output current $I_O$ through the now forward biased Schottky diode S1, pulling the output pin 12 and the bus line 13 towards $V_{GND}$.

The output voltage $V_O$ does not reach $V_{GND}$, however. The transistor N1 is designed to have a certain on-resistance $R_{DSN1}$ which causes $V_O$ to limit at the desired level $V_{OL}$ (1.0v for Futurebus+), while $I_O$ settles to a static value $I_{OL}$. The value $R_{DSN1}$ required to give a desired combination of $V_{OL}$ and $I_{OL}$ can be determined from a knowledge of VBE and $\beta$ for the NPN transistor Q2 through the relation:

$$R_{DSN1} = \frac{\beta(V_{OL} - V_{BE})}{I_{OL}}$$

The desired setting of $V_{OL}$ holds over a wide range of temperature, since the gain of the N-channel transistor N1 decreases as VBE of the NPN transistor Q2 decreases with increasing temperature.

In the $V_{OL}$ state, the driver circuit has active control of the level on the bus line 13. This allows control to be taken by any one of many such circuits connected to the bus line 13 in a wired-AND configuration. The non-controlling circuits simply remain in the $V_{OH}$ state.

For the Futurebus+ system, the static output current $I_{OL}$ is nominally 80 milliamps (mA). With $I_{OL}=80mA$, a bus line having a total capacitance of 150pF can be driven through a swing of one volt (that is, from $V_{OH}$ to $V_{OL}$) in just under two nanoseconds (ns). If 2ns is a desired switching speed for the bus system, it becomes apparent why a limit such as 5pF must be imposed on the output capacitance of each passive driver attached to the bus line, even with such a high current drive capability. The 150pF may for example comprise 100pF due to the bus line itself and 50pF due to ten other drivers being connected to the same bus line.

The lower NPN transistor Q2 has to be large enough to supply the large current $I_{OL}$ for the duration of the $V_{OL}$ state, which results inevitably in a high power dissipation ($V_{OL} \times I_{OL} = 1.0 \times 0.08 = 0.8$ watts) within the driver chip in the $V_{OL}$ state. The pins 12 ($V_O$) and 24 ($V_{GND}$) and the corresponding internal interconnections must be constructed to carry the large current. In an integrated circuit with nine such driver circuits, the static ground supply current through pin 24 ($V_{GND}$) might reach 700-800mA accompanied by 7-8 watts of on-chip power dissipation. A circuit designed to cope with worst-case conditions might expect to supply $I_{OL}$ as high as 100mA.

In this context, any additional on-chip power dissipation or current supply requirement for the circuit is very undesirable. The particular lower drive arrangement 30 in the circuit of FIG. 1 contributes to a lower on-chip power dissipation. In particular, the connection of the drain of the N-channel transistor N1 to the output pin 12, beyond the output Schottky diode S1, results in the base current $I_{Q2B}$ (equal to $I_{OL}/\beta$) being drawn from the bus line 13, rather than from the chip's own positive supply terminal 22 ($V_{CC}$). Assuming a value of 100 for $\beta$, and assuming $I_{OL}=80mA$, an on-chip power dissipation of $(V_{CC}-V_{BE}) \times I_{Q2B}$, at least 3.4 milliwatts (mW), is avoided per driver circuit. In fact, a more conventional control arrangement would have to generate several times the nominal value of $I_{Q2B}$, because of the need to compensate $V_{OL}$ against worst-case variations of operating temperature and supply voltage. The gain $\beta$ of the bipolar transistor Q2 might for example vary from 60 to 200 over a typical range of operating temperature. Assuming again that nine driver circuits are integrated on a single chip, a potential 150-200mW of on-chip power dissipation has been avoided. There is moreover no corresponding increase in the power dissipation in the backplane or anywhere else off-chip, since $I_{OL}$ is the same whether or not it includes the control current $I_{Q2B}$.

A further benefit of drawing the base current for the transistor Q2 from the output terminal is that the positive supply terminal 22 ($V_{CC}$) needs to pass no significant static current, in either state. Only a transient current is drawn during the transition from the $V_{OL}$ state to the VOH state.

Those skilled in the art Will appreciate that many variations of driver circuit are possible around the basic driving arrangement 30. Such variations will inevitably result when such a driving arrangement is adapted to different applications other than the Futurebus+ backplane. The polarities of the various transistors and diodes may be reversed, different voltage levels and current requirements may arise, and so forth. A complementary pair of such driving arrangements may be desirable in another application. The circuit need not be constructed in BiCMOS technology. The N-channel base control transistor N1 could be replaced by a bipolar transistor, although this might require a very small base current to be drawn from $V_{CC}$ or from the input terminal 10.

Figure 4:
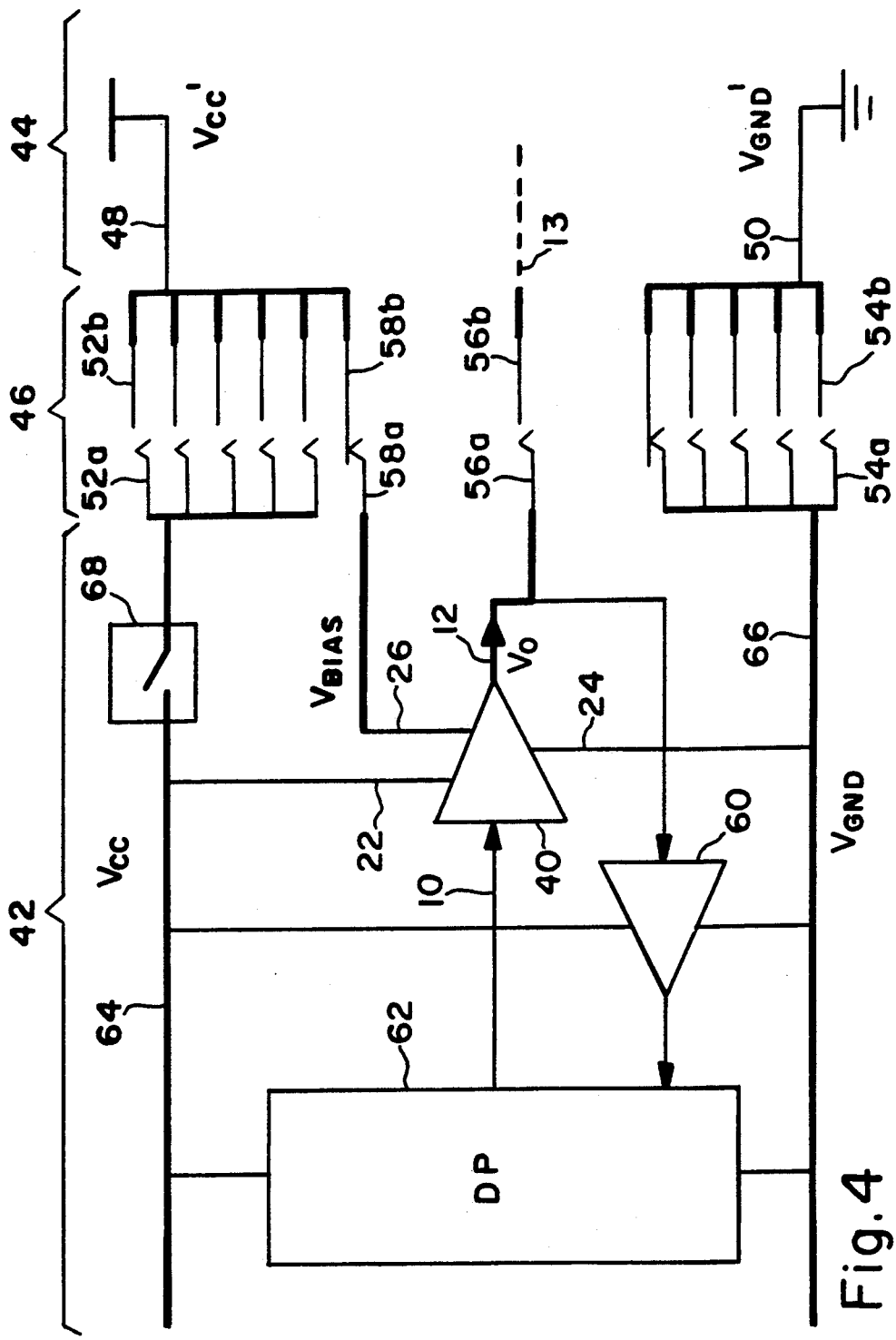
FIG. 4 shows a circuit module including the driver circuit of FIG. 1.

FIG. 4 shows the driver circuit of FIG. 1 (referenced 40 in FIG. 4) as part of a larger circuit module 42, which makes use of the driver circuit's features for so-called live insertion. The terminals and signals of the driver circuit 40 are identified by the same reference signs as in FIG. 1. The module 42 may for example comprise a single integrated circuit, a multichip package or a printed circuit board. The module 42 is connected in operation to other modules via bus system in the form of a backplane 44, and is removably connected to the backplane 44 by a connector 46 having mating pairs of contacts suffixed "a" and "b". The backplane 44 includes the bus line 13 of FIG. 1, and supply lines 48 ($V_{CC}'$) and 50 ($V_{GND}'$). The bus line 13 may be unique in the backplane, carrying only serial data, or it may be just one of tens or hundreds of bus lines, carrying parallel data.

Within the connector 46, a group of mating contact pairs 52a/52b is provided for connecting the module 42 to the $V_{CC}'$ supply line 48 of the backplane. Another group of mating contact pairs 54a/54b is provided for connecting the module 42 to the $V_{GND}'$ supply line 50. A single contact pair 56a/56b connects the module 42 to the bus line 13. An additional contact pair 58a/58b, distinct from the group 52a/52b, also connects the module to the $V_{CC}'$. The contact pair 58a/58b and at least one of the contact pairs in the group 54a/54b are constructed so as to make contact before the contact pairs 52a/52b and 56a/56b during mating of the connector 46. The connector 46 is shown in FIG. 4 in an intermediate state of insertion in which only the contact pairs 58a/58b and 54a/54b are mated.

Within the circuit module 42 the driver circuit 40, a receiver circuit 60 and a data processing (DP) circuit 62 are all connected for operation to module supply lines 64 ($V_{CC}$) and 66 ($V_{GND}$). The $V_{GND}$ supply line 66 is connected directly to the contacts 54a of the connector 46, While the $V_{CC}$ supply line 64 is connected to the contacts 52a through a switch 68. The bias supply terminal 26 ($V_{BIAS}$) of the driver circuit 40 is connected data from the contact 56a (bus line 13) via the receiver circuit 60. The DP circuit is connected for transmission of data to the input terminal 10 of the driver circuit 40, whose output 12 ($V_O$) is also connected to the contact 56a.

Live insertion is the action of connecting the circuit module 42 to the backplane 44 while the backplane is active, and other modules (not shown) are communicating via the bus line 13. The main voltage supply lines 64 and 66 for the module 42 are connected via groups of contact pairs because the supply currents for the module are too great for a single contact pair. The switch 68 is used to block the main supply currents during live insertion, since one contact pair in each group will inevitably mate first, and would otherwise be damaged or destroyed by the large current. The switch may be closed manually or automatically to activate the circuit module 42 once all contact pairs are fully mated.

During live insertion, the sudden connection of the inactive driver circuit output 12 to the bus line 13 imposes a transient load on the bus line 13, while the output capacitance of the driver circuit charges to the unknown level present on the bus line 13. If this output capacitance were to include the large Miller capacitance $C_{Q2}$ of the bipolar transistor Q2 (FIGS. 1 and 3), the resulting noise on the bus line could easily cause loss of data or perhaps a total system failure. Since the switch 68 is not yet closed, the main positive supply $V_{CC}$ is not available to reverse bias the output Schottky diode S1 and so isolate $C_{Q2}$ from the output terminal In the circuit module 42, however, the bias supply terminal 26 ($V_{BIAS}$) of the driver circuit 40 is arranged to receive the bias voltage $V_{BIAS}$ independently of the main voltage supply $V_{CC}$, and before contact is made with the bus line 13. This bias supply is used in the driver circuit 40 to pre-bias the output 12 of the driver circuit as follows.

Before power is applied to the circuit, all points can be assumed to be discharged to a common level, $V_{GND}$. In particular, the $V_{CC}$ supply pin 22 is assumed to be at $V_{GND}$. Leakage through insulation or atmosphere will generally ensure this state. If necessary, additional Schottky diodes S4 and S5 can be added as shown by broken lines in FIG. 1, where they will discharge respective nodes in the circuit almost to $V_{GND}$ without affecting normal operation.

When $V_{BIAS}$ is applied before $V_{CC}$, as shown in FIG. 4, the P-channel transistor P1 gets turned on by the connection of its gate to the $V_{CC}$ pin 22 via the resistor R1. This completes a current path from the $V_{BIAS}$ pin 26 to the junction of the collector of the lower NPN transistor Q2 and the cathode of the Schottky diode S1. This current path is represented in FIG. 3 and includes the diodes D1, D2 and S3. The current through this path therefore draws the collector of transistor Q2 to a voltage $V_C$ which is fixed below $V_{BIAS}$ by an amount equal to the sum of the forward voltage drops across those diodes. Assuming $V_{BIAS}=5.0v$, $V_C$ will be a little over 3 volts.

With the collector of transistor Q2 at or above $V_{OH}$ in this manner, no transient current needs to be drawn from the bus line 13 to charge the Miller capacitance $C_{Q2}$ of the transistor Q2 when contact is made between the output pin 12 ($V_O$) and the bus line. Moreover, the Schottky diode S1 is reverse biased ($V_C$ is greater than $V_{OH}$ and $V_t$). The low operating output capacitance $C_O$ of the driver circuit (approximately $C_{S1}+C_{E1}+C_P$) is therefore in place as a barrier to large transients before the output terminal 12 is connected to the bus line 13.

The total output capacitance $C_O$ will be seen to comprise a first component (chiefly $C_{S1}$) in series with transistor Q2 and a second component (chiefly $C_{E1}=C_P$) in parallel with transistor Q2. In addition to charging the transistor Q2 and isolating the capacitance CQ2 from the output pin 12, the current from the $V_{BIAS}$ pin 26 also charges the capacitive voltage divider formed by these two components of the output capacitance $C_O$. If $C_{S1}$ is designed to be approximately equal to $C_{E1}+C_P$, then the output pin 12 ($V_O$) will be charged to a voltage midway between $V_{GND}$ and $V_C$. Since $V_C$ is a little over 3 volts in the example, the output pin 12 becomes charged to a voltage between the Futurebus+ logic levels $V_{OH}$ and $V_{OL}$, somewhere close to the threshold voltage $V_{TH}=1.55V$. Consequently, transient current from the bus line 13 will only be required to charge $C_O$ the short distance from $V_{TH}$ to the level $V_{OH}$ or $V_{OL}$ prevailing on the bus line 13 when contact is made. By this means, the noise resulting from mating of the contact pair 56a/56b is further reduced, to a level at which it is very unlikely to cause data loss for the other modules connected to the bus line 13.

When the switch 68 is eventually closed, and the terminal 22 of the driver circuit 40 is connected to the backplane supply line 48, the P-channel transistor P1 turns off, allowing normal operation of the driver circuit to commence. Since the collector of the lower transistor Q2 is pre-charged to the voltage $V_C$ above $V_{OH}$, the circuit is essentially already in the passive, $V_{OH}$ state. Thus the module 42 can commence receiving data from the bus line 13 without introducing any further noise to the system.

The Schottky diode S3 serves a further purpose in addition to its role in setting VC. If the live insertion facility is not in use, or if the $V_{BIAS}$ supply fails, either the Schottky diode S3 or the transistor P1 will isolate the $V_{BIAS}$ terminal 26 from the rest of the circuit whether that terminal is tied to $V_{CC}$, tied to $V_{GND}$, or left floating.

Those skilled in the art will readily appreciate that many variations of the pre-biasing arrangement described are possible. For example, the bias supply voltage $V_{BIAS}$ could be provided by a battery supply within the circuit module 42, rather than by a special arrangement of contacts in the backplane connector 46. Those skilled in the art will further appreciate how the pre-charging of the various capacitances can be adjusted to allow low-noise live insertion in a given application. The voltage drops in the pre-charging current path can be altered as required, and also the capacitances if necessary, subject of course to other constraints. In particular, the capacitance of a diode such as the Schottky diode S1 can be altered by varying the size or nature of the device itself and/or by varying the size of the reverse bias voltage applied to the diode during the pre-charging.

It will apparent that the provision and efficacy of the particular lower driving arrangement 30 is in no way dependent on the provision of a pre-biasing mechanism for live insertion, and vice versa.

We claim:

1. A driver circuit comprising:
    an output terminal for connection to a bus line;
    a first supply terminal for connection to a first voltage source;
    first drive means for in a first state of the driver circuit completing a current path from the output terminal to the first supply terminal for passage of an output current;
    control means for supplying a control current to the first drive means; and
    an output diode connected in the path of the output current for isolating the first drive means from the output terminal in a second state of the driver circuit;
    wherein the control means is connected to the output terminal beyond the output diode so as to draw the control current for the first drive means from the output terminal.

2. A driver circuit as claimed in claim 1 wherein the first drive means comprises a bipolar transistor whose base current is the control current.

3. A driver circuit as claimed in claim 1 wherein the output diode is a Schottky diode.

4. A driver circuit as claimed in claim 2 wherein the control means has a characteristic resistance such that the bipolar transistor is prevented from saturating in the first state, and instead maintains a predetermined voltage at the output terminal, relative to the first voltage source.

5. A driver circuit as claimed in claim 2 wherein the control means comprises an insulated gate field-effect transistor whose drain-source path is connected between the output terminal and the base of the bipolar transistor.

6. A driver circuit as claimed in claim 4 wherein the control means comprises an insulated gate field-effect transistor whose drain-source path is connected between the output terminal and the base of the bipolar transistor and whose drain-source on-resistance constitutes the characteristic impedance of the control means.

7. A driver circuit as claimed in claim 4 wherein the predetermined voltage at the output terminal in the first state is between 0.75 volt and 1.1 volts, relative to the first voltage source.

8. A driver circuit as claimed in claim 1 wherein the first drive means and the output diode are capable of passing a static output current of eighty milliamps (80mA) in the first state, while the effective capacitance of the circuit at the output terminal does not exceed five picofarads (5pF) in the second state.

9. A driver circuit as claimed in claim 2 wherein the first drive means and the output diode are capable of passing a static output current of eighty milliamps (80mA) in the first state, while the effective capacitance of the circuit at the output terminal does not exceed five picofarads (5pF) in the second state.

10. A driver circuit as claimed in claim 2 further comprising:
active turn-off coupled to the base of the bipolar transistor for in the second state pulling the base of the bipolar transistor towards the voltage of the emitter of said bipolar transistor.

11. A driver circuit as claimed in claim 10 wherein the active turn-off means includes means for maintaining a predetermined voltage on the base of the bipolar transistor, relative to the emitter, which voltage is intermediate between zero and the characteristic base-emitter voltage ($V_{BE}$) of the bipolar transistor.

12. A driver circuit as claimed in claim 1 further comprising:
a second supply terminal for connection to a second voltage source; and
second drive means coupled between the second supply terminal and an electrode of the output diode remote from the output terminal for in the second state pulling said electrode toward the voltage of the second voltage source, so as to reverse bias the output diode.

13. A driver circuit as claimed in claim 12 wherein the second drive means includes means for limiting the reverse bias applied to the output diode in the second state.

14. A driver circuit as claimed in claim 13 wherein the voltage of the output terminal in the second state is between 1.9 and 2.0 volts, the voltage of the second voltage source is between 4.5 and 5.5 volts, and the voltage on the output diode electrode in the second state is between 2.5 and 4.0 volts, all relative to the first voltage source.

15. A driver circuit as claimed in claim 12 further comprising pre-biasing means for reverse biasing the output diode before activation of the second voltage source.

16. A driver circuit as claimed in claim 15 wherein the prebiasing means comprises a bias supply terminal for connection to a bias voltage source, which bias voltage source is connected and active before connection of the output terminal to the bus line.

17. A driver circuit comprising:
an output terminal for connection to a bus line;
a first supply terminal for connection to a first voltage source;
first drive means for in a first state of the driver circuit completing a current path from the output terminal to the first supply terminal for passage of an output current;
an output diode connected in the path of the output current for isolating the first drive means from the output terminal in a second state of the driver circuit; and
pre-biasing means coupled to an electrode of the output diode remote from the output terminal for applying a reverse bias to the output diode before connection of the output terminal to the bus line.

18. A driver circuit as claimed in claim 17 wherein the capacitance of the reverse-biased output diode forms a capacitive divider with a capacitance inherent between the output terminal and the first supply terminal, such that the pre-biasing means establishes on the output terminal, before connection of the output terminal to the bus line, an intermediate voltage between the voltages present on the output terminal in the first and second states of the circuit.

19. A driver circuit as claimed in claim 17 wherein the prebiasing means comprises a bias supply terminal for connection to a bias voltage source, which bias voltage source is connected and active before connection of the output terminal to the bus line.

20. A driver circuit as claimed in claim 19 further comprising means for isolating the bias supply terminal from the remainder of the circuit when no bias voltage source suitable for prebiasing is connected to the bias supply terminal.

21. A driver circuit as claimed in claim 17 wherein the first drive means and the output diode are capable of passing a static output current of eighty milliamps (80mA) in the first state, while the effective capacitance of the circuit at the output terminal does not exceed five picofarads (5pF) in the second state.

22. In an integrated circuit having an output terminal for removable connection to a bus line carrying a two-level data signal, a main supply terminal for connection to a main voltage source and a bias supply terminal for connection to a bias voltage source: a driver circuit having an output connected to the output terminal of the integrated circuit and a pre-biasing means connected to the bias supply terminal of the integrated circuit, the pre-biasing means operating, when the bias supply terminal is connected to the bias voltage source, to bias the output terminal of the integrated circuit to an intermediate level between the two levels of the data signal before connection of the output terminal to the bus line, the driver circuit further comprising means for disabling the pre-biasing means upon subsequent connection of the main voltage source to the main supply terminal.

23. A circuit module having terminals arranged in a bus connector for removable connection to a bus system which includes voltage supply lines and at least one data bus line carrying a two-level data signal, the circuit module including a driver circuit comprising:

an output terminal arranged in the bus connector for removable connection to the data bus line;

a main supply terminal arranged in the bus connector for removable connection to one of the voltage supply lines;

pre-biasing means for biasing the output terminal of the driver circuit to an intermediate level between the two levels of the data signal before connection of that terminal to the bus line, the pre-biasing means comprising a bias supply terminal for connection to a bias voltage source before connection of the output terminal to the bus line; and means for disabling the pre-biasing means upon subsequent connection of the main supply terminal to the voltage supply line, wherein the circuit module further includes:

means for ensuring application of a bias voltage to the bias supply terminal for the driver circuit before connection of the output terminal to the bus line during connection of the circuit module to a live bus system.

24. A circuit module having terminals for removable connection to a bus system which includes voltage supply lines and at least one data bus line, the circuit module including a driver circuit comprising:

an output terminal arranged for removable connection to the data bus line;

a first supply terminal arranged for removable connection to a first one of the voltage supply lines;

first drive means for in a first state of the driver circuit completing a current path from the output terminal to the first supply terminal for passage of an output current;

an output diode connected in the path of the output current for isolating the first drive means from the output terminal in a second state of the driver circuit; and a bias supply terminal for receiving a bias voltage to enable the application of a reverse bias to the output diode before connection of the output terminal to the bus line, wherein the circuit module further includes:

means for ensuring application of a bias voltage to the bias supply terminal of the driver circuit before connection of the output terminal to the bus line during connection of the circuit module to a live bus system.

25. A driver circuit as claimed in claim 22 comprising drive means for passing an output current from the bus line to a circuit supply terminal of the integrated circuit, wherein:

an output capacitance of the circuit comprises a first component in series with the drive means and a second component in parallel with the drive means; and pre-biasing means comprises means for charging in series to a predetermined level the first and second components of the output capacitance, such that the output terminal is charged to the intermediate level by division of charge between the first and second components of the output capacitance.

26. A driver circuit as claimed in claim 25 wherein the first component of the output capacitance includes the reverse biased capacitance of an output diode connected in the path of the output current between the drive means and the output terminal.

27. A driver circuit as claimed in claim 25 wherein the second component of the output capacitance includes the capacitance of a electrostatic discharge protection device.

28. A driver circuit as claimed in claim 22 wherein the circuit is constructed for operation from a supply voltage of between 4.5 and 5.5 volts, while the two levels of the data signal on the bus line are between 0.75 volt and 1.1 volts, and 1.9 and 2.0 volts respectively, all relative to a reference voltage.

29. A circuit module as claimed in claim 24 wherein the means for ensuring application of the bias voltage comprises a voltage source independent of the connection to the bus system.

30. A circuit module as claimed in claim 24 wherein the means for ensuring application of the bias voltage comprises a bus connector constructed so that, during mating of the bus connector as a whole, a first contact pair, coupled between the bias supply terminal of the driver circuit and a supply line of the bus system, mates before a second contact pair, coupled between the output terminal of the driver circuit and the data bus line.

31. A circuit module as claimed in claim 30 wherein the bus connector further comprises a group of at least two contact pairs connected in parallel for conduction of a main supply current to the module, the circuit module comprising means for preventing conduction of the main supply current until all pairs in the group are mated, while the bias supply terminal of the driver circuit is coupled to the supply line of the bus system immediately upon contact of the first contact pair.

32. A circuit module as claimed in claim 23 wherein the means for ensuring application of the bias voltage comprises a voltage source independent of the connection to the bus system.

33. A circuit module as claimed in claim 23 wherein the means for ensuring application of the bias voltage comprises a bus connector constructed so that, during mating of the bus connector as a whole, a first contact pair, coupled between the bias supply terminal of the driver circuit and a supply line of the bus system, mates before a second contact pair, coupled between the output terminal of the driver circuit and the data bus line.

34. A circuit module as claimed in claim 33 wherein the bus connector further comprises a group of at least two contact pairs connected in parallel for conduction of a main supply current to the module, the circuit module comprising means for preventing conduction of the main supply current until all pairs in the group are mated, while the bias supply terminal of the driver circuit is coupled to the supply line of the bus system immediately upon contact of the first contact pair.

35. A driver circuit as claimed in claim 34 further comprising means for isolating the bias supply terminal from the remainder of the driver circuit once conduction of the main supply current is established.

36. A driver circuit as claimed in claim 22 comprising drive means for passing an output current from the bus line to a further supply terminal, the pre-biasing means further comprising voltage divider means coupled between the bias supply terminal and the further supply terminal and further coupled to the output terminal for generating said intermediate level.

* * * * *